US007810061B2

(12) United States Patent
Minonne et al.

(10) Patent No.: US 7,810,061 B2
(45) Date of Patent: Oct. 5, 2010

(54) METHOD AND SYSTEM FOR CREATING A USEFUL SKEW FOR AN ELECTRONIC CIRCUIT

(75) Inventors: Salvatore D. Minonne, Cagnes sur Mer (FR); Francois Silve, Moins Sartoux (FR); Thomas Menguy, Biot (FR); Conor O'Sullivan, Dublin (IE)

(73) Assignee: Cadence Design Systems, Inc., San Jose, CA (US)

( * ) Notice: Subject to any disclaimer, the term of this patent is extended or adjusted under 35 U.S.C. 154(b) by 161 days.

(21) Appl. No.: 11/022,082

(22) Filed: Dec. 21, 2004

(65) Prior Publication Data

US 2006/0064658 A1 Mar. 23, 2006

Related U.S. Application Data

(60) Provisional application No. 60/611,208, filed on Sep. 17, 2004.

(51) Int. Cl.
*G06F 17/50* (2006.01)

(52) U.S. Cl. .................................. 716/6; 716/2; 716/4
(58) Field of Classification Search .................. 716/6, 716/10, 2, 4; 326/93
See application file for complete search history.

(56) References Cited

U.S. PATENT DOCUMENTS

| | | | | |
|---|---|---|---|---|
| 5,396,435 A * | 3/1995 | Ginetti | ........................... | 716/6 |
| 5,410,491 A * | 4/1995 | Minami | ........................ | 716/6 |
| 5,507,029 A * | 4/1996 | Granato et al. | .................. | 716/6 |
| 5,557,779 A * | 9/1996 | Minami | .......................... | 716/6 |
| 5,608,645 A * | 3/1997 | Spyrou | ........................... | 716/6 |
| 5,838,581 A * | 11/1998 | Kuroda | ........................... | 716/8 |
| 6,023,568 A * | 2/2000 | Segal | ............................. | 716/6 |
| 6,099,584 A * | 8/2000 | Arnold et al. | ................. | 716/19 |
| 6,272,668 B1 * | 8/2001 | Teene | .......................... | 716/10 |
| 6,314,547 B1 * | 11/2001 | Donath et al. | .................. | 716/8 |
| 6,484,298 B1 * | 11/2002 | Nag et al. | ....................... | 716/6 |
| 6,550,044 B1 * | 4/2003 | Pavisic et al. | ................... | 716/6 |
| 6,550,045 B1 * | 4/2003 | Lu et al. | ........................ | 716/6 |
| 6,591,407 B1 * | 7/2003 | Kaufman et al. | .............. | 716/10 |
| 6,654,712 B1 * | 11/2003 | Blair | ............................. | 703/14 |
| 6,678,870 B2 * | 1/2004 | Okada et al. | .................... | 716/6 |
| 6,701,507 B1 * | 3/2004 | Srinivasan | ................... | 716/10 |
| 6,763,506 B1 * | 7/2004 | Betz et al. | ....................... | 716/6 |
| 6,763,513 B1 * | 7/2004 | Chang et al. | .................. | 716/14 |
| 6,782,519 B2 * | 8/2004 | Chang et al. | ................... | 716/6 |

(Continued)

OTHER PUBLICATIONS

Kourtev, Ivan S. et al., *Timing Optimization Through Clock Skew Scheduling*, (2000) Kluwer Academic Publishers. Norwell, Massachusetts, USA.

*Primary Examiner*—Paul Dinh
*Assistant Examiner*—Patrick Sandoval
(74) *Attorney, Agent, or Firm*—Vista IP Law Group LLP

(57) ABSTRACT

A method of determining a useful skew for a circuit design includes computing a slack value for each sequential cell in the circuit design, identifying modifiable sequential cells in the circuit design, and computing a target delay for each modifiable sequential cell. One or more sequential cells are discarded based on the slack values. A target slack value for each remaining sequential cell is determined. The remaining cells are sorted based on the target slack values to determine a minimum target slack value, and a delay for each cell is determined based on the minimum target slack value.

41 Claims, 5 Drawing Sheets

U.S. PATENT DOCUMENTS

| | | | | |
|---|---|---|---|---|
| 6,810,515 B2* | 10/2004 | Lu et al. | | 716/18 |
| 6,941,533 B2* | 9/2005 | Andreev et al. | | 716/6 |
| 7,003,741 B2* | 2/2006 | Srinivasan | | 716/2 |
| 7,047,506 B2* | 5/2006 | Neves et al. | | 716/2 |
| 7,075,336 B2* | 7/2006 | Kojima et al. | | 326/93 |
| 2001/0021992 A1* | 9/2001 | Yamashita | | 716/8 |
| 2003/0051222 A1* | 3/2003 | Williams et al. | | 716/12 |
| 2003/0135836 A1* | 7/2003 | Chang et al. | | 716/11 |
| 2003/0182634 A1* | 9/2003 | Chang et al. | | 716/1 |
| 2004/0064799 A1* | 4/2004 | Reyes | | 716/6 |
| 2004/0111686 A1* | 6/2004 | Chang et al. | | 716/6 |
| 2004/0210857 A1* | 10/2004 | Srinivasan | | 716/2 |
| 2005/0050497 A1* | 3/2005 | Tetelbaum | | 716/6 |
| 2005/0066297 A1* | 3/2005 | Kalafala et al. | | 716/6 |
| 2005/0132316 A1* | 6/2005 | Suaris et al. | | 716/11 |
| 2005/0268263 A1* | 12/2005 | Sun et al. | | 716/6 |
| 2006/0048085 A1* | 3/2006 | Tyler et al. | | 716/6 |

* cited by examiner

METHOD AND SYSTEM FOR CREATING A USEFUL SKEW FOR AN ELECTRONIC CIRCUIT

This application claims benefit of Provisional Application Ser. No. 60/611,208 filed on Sep. 17, 2004 which is hereby incorporated by reference as if fully set forth herein.

BACKGROUND

When designing a digital circuit, a fundamental goal is to satisfy overall timing constraints. An important part of achieving this goal is controlling the circuit's clock skew, which is the difference between the arrival times of the clock signal at different flip-flops in the circuit. The clock skew may be caused by several things, such as variations in the gate delays of the clock drivers, variations in the loads of the clock drivers, variations in the wire lengths between clock drivers, the position of the memory elements being driven, or the clocking strategy, for example.

The clock skew between two flip-flops in the circuit, FF1 and FF2, should be greater than the hold time minus the shortest path delay. The clock skew should also be smaller than the clock period minus the longest path plus the setup time. Any timing values that respect these constraints will be considered valid.

Traditionally, design methodologies try to meet these timing constraints between flip-flops in a circuit by causing the clock skew to be zero. However, due to deep submicron problems, such as interconnect delay, coupling noise, IR drop, electro-migration, process variation, and on-chip inductance, for example, designing a circuit that operates with a clock skew of zero is very difficult. As a result designers use skew to meet timing constraints.

Historically, two different approaches have been used to take advantage of skew in the circuit, a linear programming approach and a graph based approach. However, both of these approaches require intensive computations, and they also have a high impact on the clock tree.

SUMMARY

A method of modifying skew to improve circuit performance includes computing a slack value for each sequential cell in the circuit design, identifying modifiable sequential cells in the circuit design, and computing a target delay for each modifiable sequential cell. One or more sequential cells are discarded based on the slack values. A target slack value for each remaining sequential cell is determined. The remaining cells are sorted based on the target slack values to determine a minimum target slack value, and a delay for each cell is determined based on the minimum target slack value.

DETAILED DESCRIPTION

Figure 1A:
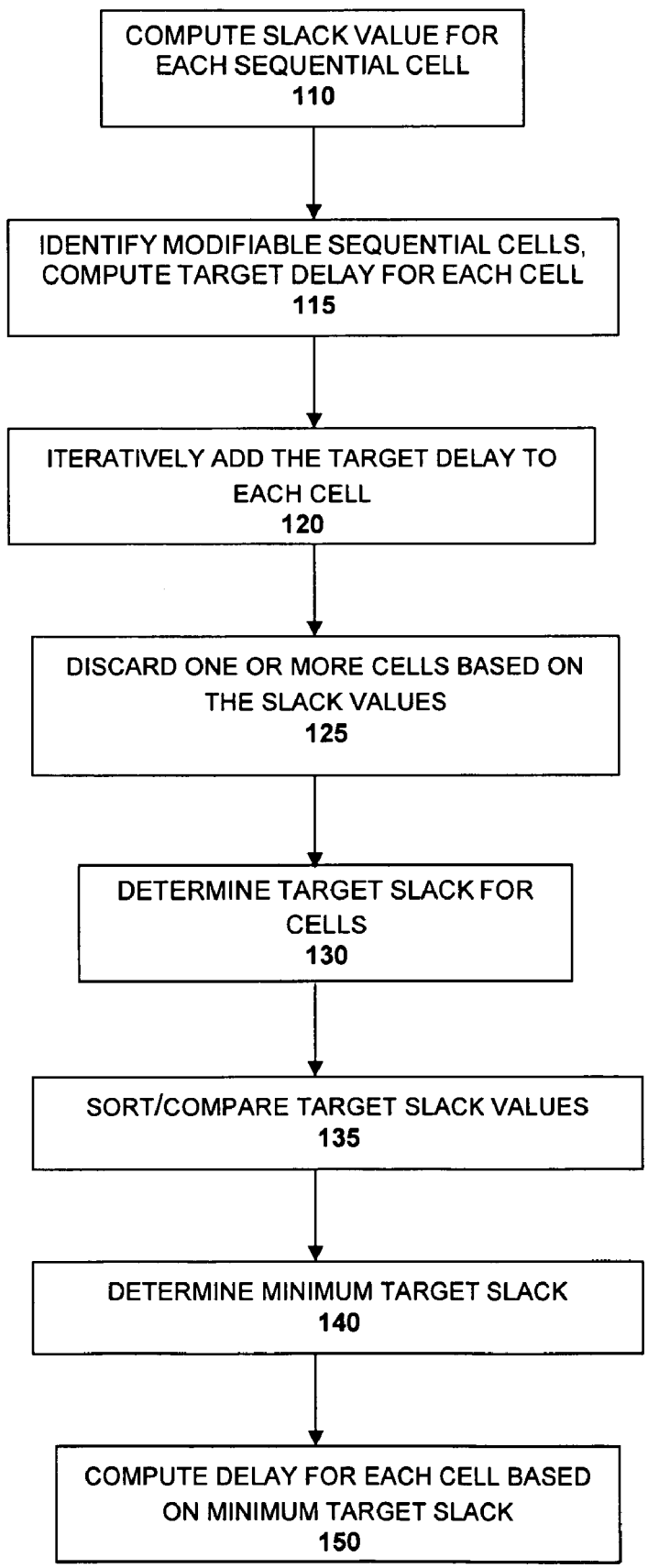
FIG. 1 shows an example of a method of providing a useful skew for a digital circuit.

An approach to circuit design includes a method of providing a useful skew. This clock skew optimization technique can be performed faster than conventional design methods, has a low impact on the clock tree, and can be used during the design process both before and after the clock tree is built. If the clock tree is built, buffering can be used to perform the useful skew method. If the clock tree is not built, the design can be modified by asserting a delay value on the clock tree leaves of a pin to provide the design with the useful clock skew. The useful skew method can be performed relatively quickly because it has a linear computation complexity. The time computational complexity is linear as only local information is used. Local information includes the slack values on an input and output pin of each sequential cell. The useful skew method can be performed with a conservative technique that has a low impact on the clock tree.

With this approach, a design is modified to achieve a timing closure if the clock tree is or is not built. The clock skew is therefore viewed as a manageable and useful resource rather than as a constraint. This method of generating this useful skew can be performed during In Place Optimization (IPO), after the initial physical layout. The IPO performs optimization tasks such as gate-sizing, buffer sizing and buffer insertion, for example. During IPO, timing constraints are satisfied by performing local transformations of the netlist and placing cells, without going through an entirely new iteration of synthesis, floor-planning and layout.

The useful skew method can improve the slack, which is a measure of satisfied timing constraints on the critical path, by closing the slack to zero. The slack can be defined as the difference between the required time at point p, and arrival time at point p, such that $$\text{Slack}(p) = \text{RequiredTime}(p) - \text{ArrivalTime}(p).$$

The required time is the output required time to a port in absolute terms. The required time can be calculated at any other point of the network by considering the propagation delay, and back-propagating the output required times. The arrival time is the input arrival time to a port in absolute terms. The arrival time can be calculated at any other point of the network by considering the propagation delay, and forward-propagating the input arrival times.

The slack may be positive, null or negative. A negative value for the slack implies that the circuit does not meet the arrival time requirements for the specified values. The useful skew technique is a methodology of creating a controlled clock skew. This controlled skew is an artificially created timing offset between the clock arrival times on flip-flops that belong to the critical path to improve the slack.

A flip-flop on the critical path may be delay-able, advance-able. A delay-able flip-flop is a sequential cell on which the clock signal arrival time can be safely delayed without worsening the slack on the critical path. For example, a flip-flop is delay-able if the slack on the D pin (SD) is negative and the slack on the Q pin (SQ) is bigger than SD, such that (SQ>SD). An advance-able flip-flop is a sequential cell on which the clock signal arrival time can be safely advanced without worsening the slack on the critical path. An example of an advance-able flip-flop is one where the slack on the Q pin (SQ) is negative and the slack on the D pin (SD) is bigger than SQ: (SD>SQ). Talking flip-flops are two flip-flops that have a combinational path between the Q output of one and the D input of the other.

The timing characteristics of the flip-flops can include a target slack and a minimum target slack. A target slack is a slack associated with each delay-able or advance-able flip-flop. For example, the target slack can be set to (SQ+SD)/2. A Minimum Target Slack is the smallest target slack among all the target slacks computed on all delay-able or advance-able flip-flops. If the minimum target slack is a positive value, then by definition the value is 0.

These timing characteristics can be modified using target delays. A padding cell is a cell used to create a target delay. A target delay is the delay to be added on the CK flip-flop pin in order to get: SD=Minimum Target Slack. A macro insertion delay is the insertion delay specified on a macro clock pin to model an already built clock tree inside the macro. If the clock tree is built, padding cells are used. If the clock tree is not built, delay is asserted and macro insertion delays are used.

The useful skew method can be performed before a clock tree synthesis (CTS) method, which builds the clock tree. CTS tools usually handle positive macro model insertion delays. Thus, if the useful skew method is performed before the clock tree is built, the useful skew method advances the clock signal arrival time on advance-able flip-flops to generate a set of constraints that can be used during CTS. For example, the useful skew methodology can generate a CTS constraint file containing all cells which should be advanced (CTS macro insertion delays), or the method can generate a list of ct_leaf attributes. When the useful skew method is performed after the clock tree is built, the method adds buffers to delay the arrival time (padding cells).

Figure 1B:
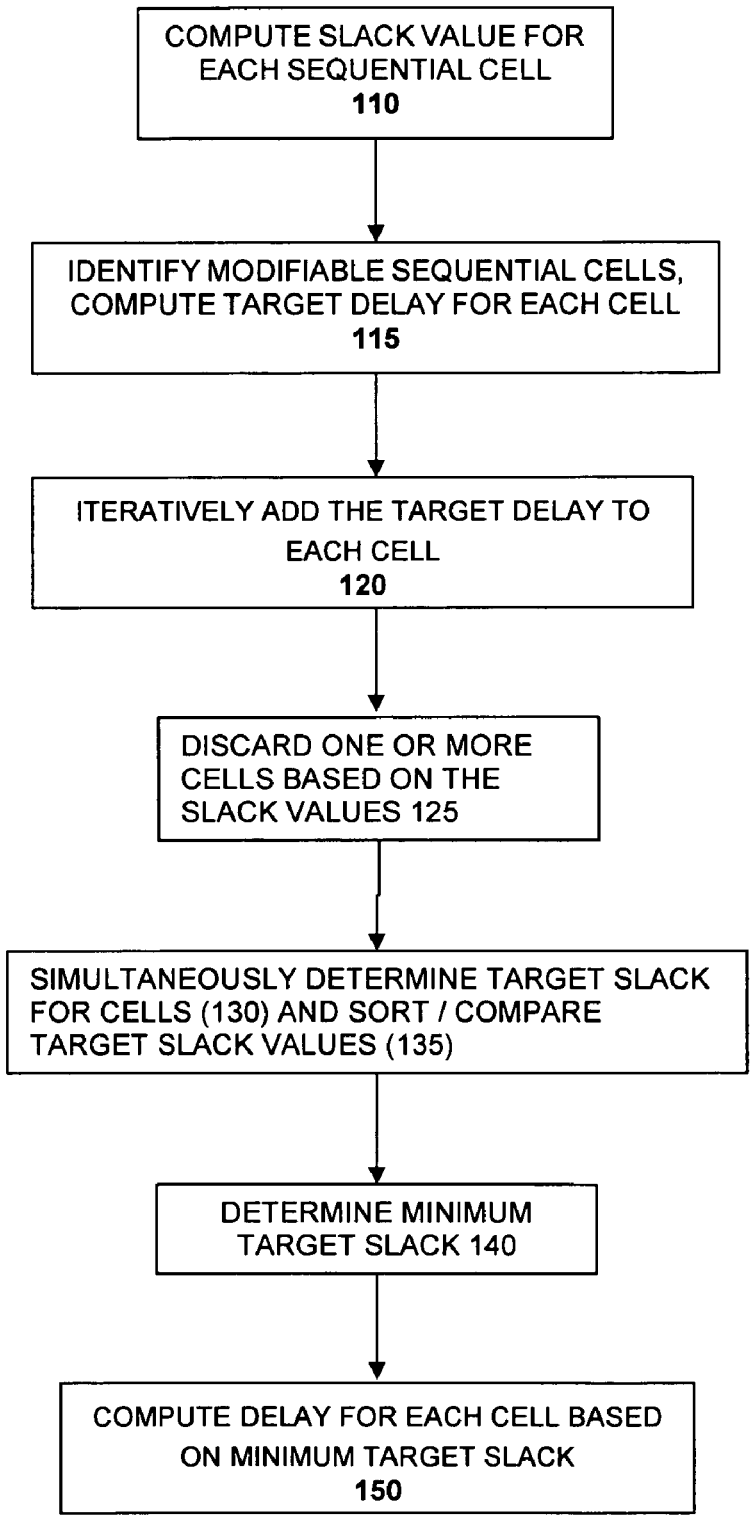

An example of a useful skew method is shown in FIG. 1. The slack on each input and output pin of each sequential cell (flip-flop) is computed, 110. The delay-able (or advance-able) flip-flops are identified, and the target delay for each is computed, 115. The process iteratively adds (or advances) the target delay to each flip-flop, 120. One benefit of the useful skew method is that it can be executed without identifying the talking flip-flops, which is CPU intensive. Therefore, the useful skew method can work on a netlist even if the clock tree is not yet built.

For each sequential cell, the output pins, or Q pins, and input pins, or D pins, are analyzed, 125. The worse (the smaller) slack values are computed on each D and Q pin. If the clock tree is already built, the node with a positive slack value on its D pins, or with slack value on the D pins bigger or equal than slack value on Q pin, such that:

Slack($D$)>0 or Slack($D$)>=Slack($Q$)

are discarded. If the clock tree is not built the condition for discarding is:

Slack($Q$)>0 or Slack($D$)<=Slack($Q$).

For the cells not discarded, the average of the slack(Q) and slack(D) is computed, 130, such that:

target slack=(slack($Q$)+slack($D$))/2.

The cells are then sorted according to the target slack value, 135. In one embodiment, the cells are sorted as the target slack is computed i.e., as each target slack is computed it is compared with the lowest target slack; if the target slack is lower, it becomes the lowest. The lowest target slack value is the minimum target slack, 140. If this is a positive value, then the minimum target slack is set to zero. The minimum target slack represents the best value achievable with one iteration of the useful skew method. After computing the minimum target slack, the method can compute the delay, 150, on each cell C as:

delay=(minimum target slack)−(slack($D$) on $C$ cell).

If the clock tree is built, then the delay will have a positive value. If the clock tree is not built, then the delay will have a negative value. A positive delay value will be used to delay the arrival time of the clock on the proper cell. A negative delay value will be used to advance the arrival time of the clock on the proper cell.

The positive delay values are created using buffers or inverters chains. These buffers or inverters will be added in front of the proper cell clock pin. The negative delay values are created by asserting a delay on the proper cell clock pin. The negative delay will be considered later by the CTS tool during the clock tree synthesis. Advancing (clock tree not built) or delaying (clock tree built) the arrival time permits a timing gain in terms of slack. The useful slew method is conservative, because it inserts a delay (positive or negative) only where improving the slack is meaningful.

Figure 2:
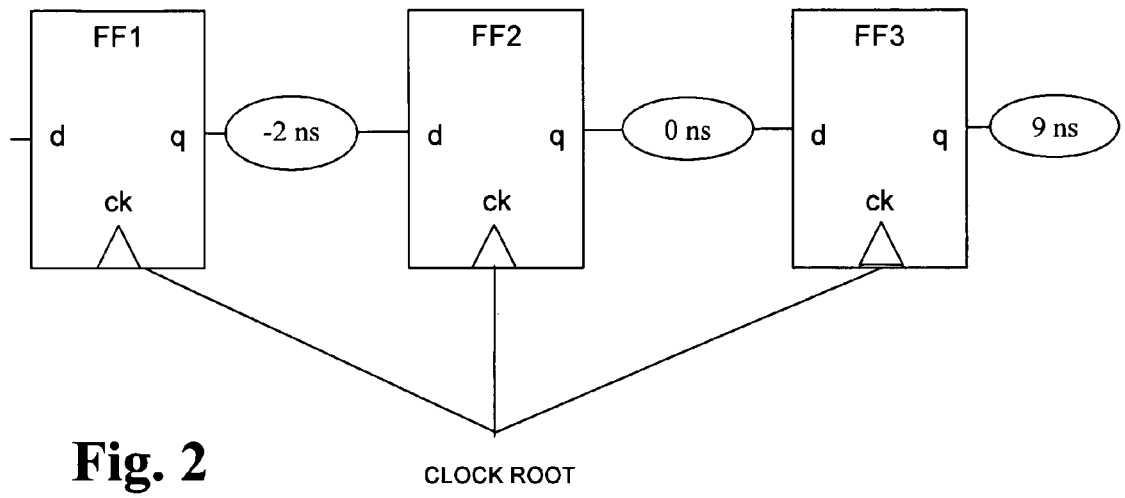
FIG. 2 shows an example of a pre CTS digital circuit that can be modified to have a useful skew.
Figure 3:
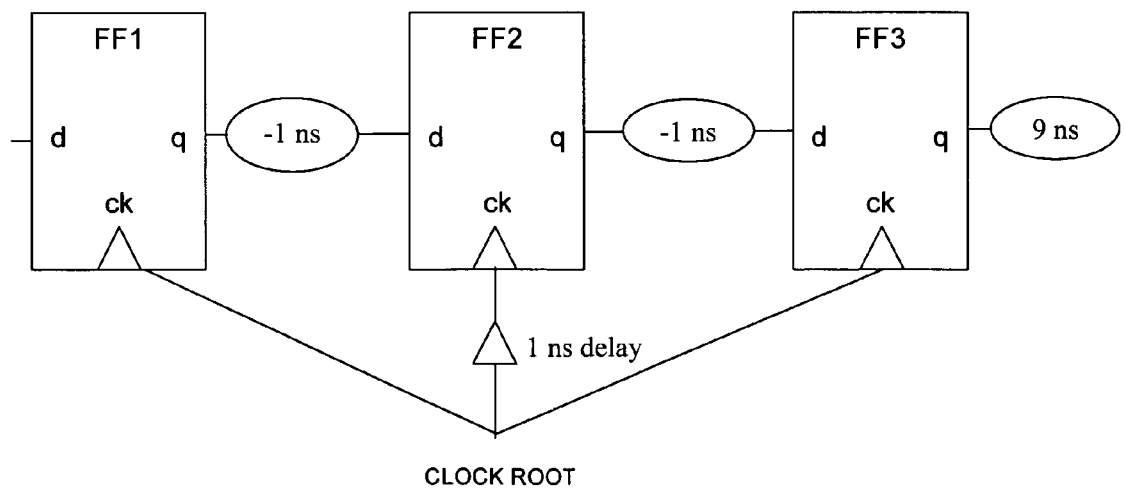
FIG. 3 shows the results of applying the useful skew method to the circuit shown in FIG. 2.

An example of a circuit design that is modified using the useful skew method is shown in FIGS. 2 and 3. In this example, the clock tree has been built. The method is used to determine a delay value for postponing the arrival time. In FIG. 2, three flip-flops are shown, including FF2, which is delay-able. The method determines that FF2 is a delay-able flip-flop because the slack on its D pin is −2 ns, and the slack on its Q pin is 0 ns. The average slack of FF2 is −1 ns. Since the minimum target slack is the smallest average slack of all delay-able flip-flops, then in this example, the minimum target slack will be −1 ns. Because the minimum target slack is negative, the method determines an appropriate buffer to add to the circuit to create the delay, using the equation:

delay=$MTS$−slack($D$)

In this example, the appropriate delay is $$\text{delay} = MTS - (\text{slack on FF2 D pin})$$
$$= -1 - (-2)$$
$$= +1 \text{ns}.$$

So a buffer to provide a delay of 1 ns is created to delay the arrival time on the CK pin of FF2, as shown in FIG. 3.

The added delay results in a useful skew which improves the timing of the circuit. The inserted buffer in FIG. 3 has postponed the arrival time on the CK pin of FF2 by 1 ns. Thanks to this inserted delay, the slack on the FF2 D pin and the FF2 Q pin has been improved. Another iteration of the useful skew methodology can then be performed. In this case, the only delay-able flip-flop is FF3, and the average slack is 4 ns. Since there is only one delay-able flip-flop, the minimum target slack is 4 ns, which is a positive value. Therefore, the minimum target slack is, by definition, set to zero. The appropriate delay to add to the circuit is $$\text{delay} = 0 - (-1)$$
$$= 1.$$

A buffer to create the delay of 1 ns can then be added in front of the CK pin of FF3. The method can be repeated until a delay-able flip-flop cannot be identified in the circuit.

Figure 4:
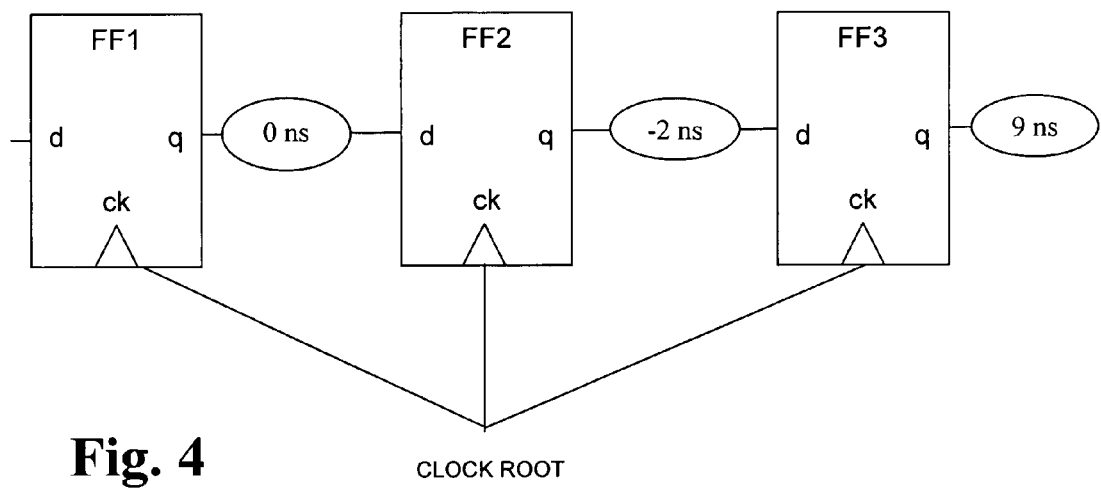
FIG. 4 shows an example of a post CTS digital circuit that can be modified to have a useful skew.
Figure 5:
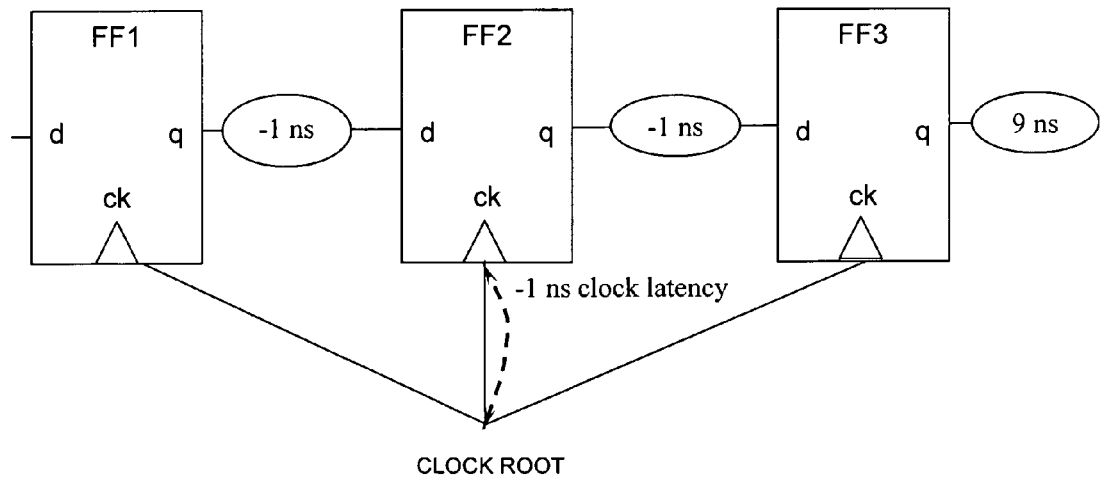
FIG. 5 shows the results of applying the useful skew method to the circuit shown in FIG. 4.

Another example of applying the useful skew method to improving a circuit design is shown in FIGS. 4 and 5. In this example, the clock tree has not been built yet. The useful skew methodology is applied to the circuit to determine an appropriate location to advance the clock signal arrival time. As shown in FIG. 4, the circuit has three flip-flops, including FF2, which is an advance-able flip-flop. The minimum target slack is equal to the average slack of FF2, minTargetSlack=−1 ns.

In this case, the appropriate timing delay is:

$$\begin{aligned} delay &= qSlack - minTargetSlack \\ &= -2 - (-1) \\ &= -1 \text{ ns}. \end{aligned}$$

Figure 6:
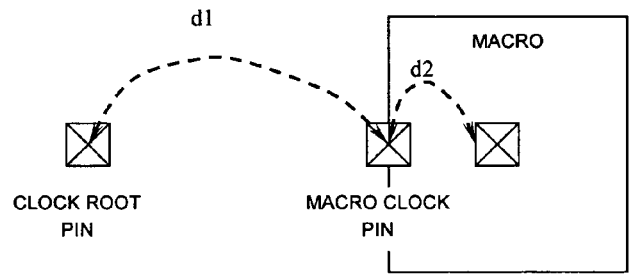
FIG. 6 shows an example of a macro-model insertion that can be used to provide a useful skew to a digital circuit.

Since the clock tree has not yet been built, the clock tree net is ideal, and a propagation delay does not exist along the net. The useful skew methodology asserts a −1 ns clock latency on the CK pin of FF2. As shown in FIG. 5, a 1 ns macro insertion delay is added on the CK pin of FF2, to assert the −1 ns clock latency. An exemplary representation of a model for the insertion delay is shown in FIG. 6, where the macro-model insertion is d2. The useful skew method in the example circuit of FIG. 5 can be repeated until no advance-able flip-flop in the circuit design can be identified. This is the case shown in FIG. 5, as the minimum target slack remains:

minTargetSlack=−1 ns, thus neither FF2 nor FF3 are advance-able, and the useful skew process ends.

The useful skew method provides several advantages over prior solutions. The useful skew method can be performed much quicker than other methods, and has a low impact on the clock tree. Unlike previous methods, such as linear programming or graph based methods, which have at least a quadratic complexity, the useful skew method has a linear time complexity. The linear time complexity is obtained thanks to the use of the minimum target slack, which is the target slack that can be safely achieved without degrading performance. Local information is used to compute the minimum target slack and the corresponding delay, so there is no need to explore all the netlist or to build complex data structure, and permits the method to have a linear time complexity.

The useful skew method also has a low impact on the clock tree, because timing changes are made to delay-able or advance-able flip-flops based on the minimum target slack. In this method, only the timing with a real impact on slack is changed. This avoids problems caused when using conventional methods, such as advancing too many flip-flops in the pre-CTS mode, which leads to a clock tree that is too difficult to build. The useful skew method also avoids inserting too many buffers (and delaying too many flip-flops) for post-CTS mode functionality, which leads to an excessive area overhead.

The useful skew method can be performed pre CTS without any change in the clock tree building algorithm used during CTS. For example, the results of the useful skew method can be used by a clock tree building algorithm that handles a macro model insertion delay. This allows the useful skew method to provide an useful skew solution without any change to the clock tree building algorithm.

System Architecture Overview

Figure 7:
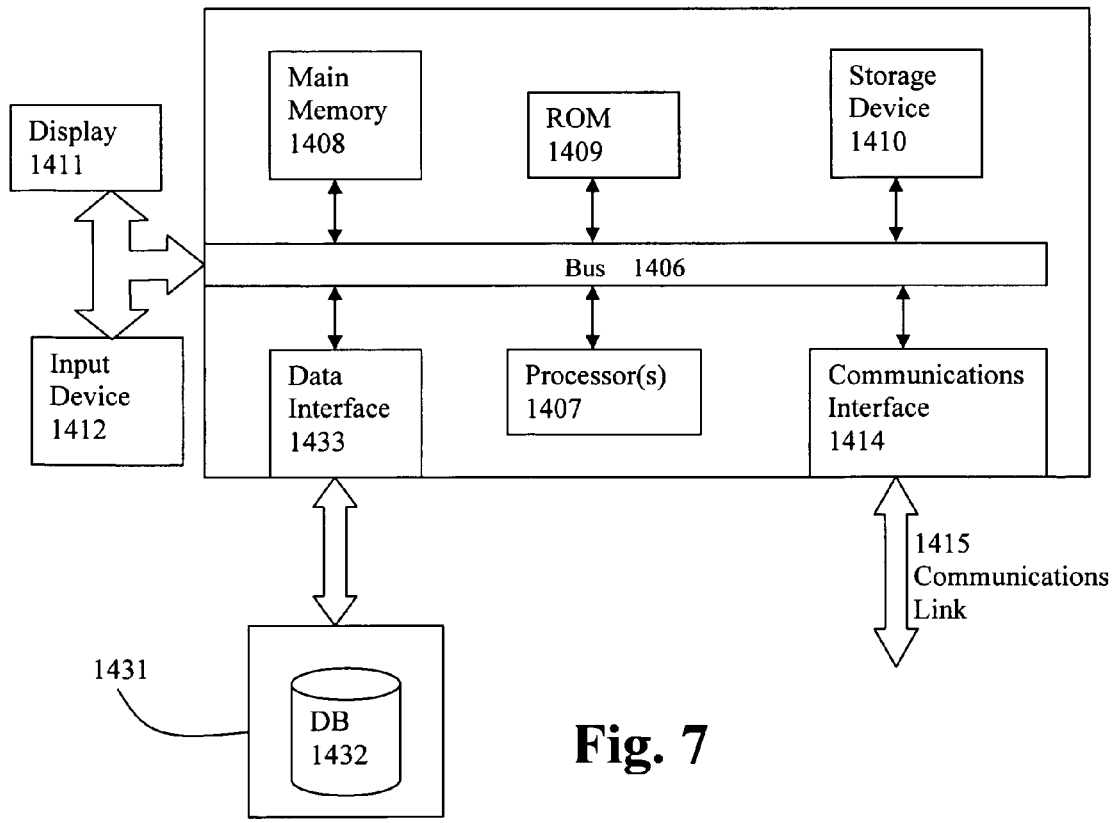
FIG. 7 shows an example computer system in which creating a useful skew for an electronic circuit can take place.

The execution of the sequences of instructions required to practice the embodiments may be performed by a computer system 1400 as shown in FIG. 7. In an embodiment, execution of the sequences of instructions required is performed by a single computer system 1400. According to other embodiments, two or more computer systems 1400 coupled by a communication link 1415 may perform the sequence of instructions required in coordination with one another. A description of only one computer system 1400 will be presented below; however, it should be understood that any number of computer systems 1400 may be used.

A computer system 1400 according to an embodiment will now be described with reference to FIG. 7, which is a block diagram of the functional components of a computer system 1400 according to an embodiment. As used herein, the term computer system 1400 is broadly used to describe any computing device that can store and independently run one or more programs.

Each computer system 1400 may include a communication interface 1414 coupled to the bus 1406. The communication interface 1414 provides two-way communication between computer systems 1400. The communication interface 1414 of a respective computer system 1400 transmits and receives electrical, electromagnetic or optical signals, that include data streams representing various types of signal information, e.g., instructions, messages and data. A communication link 1415 links one computer system 1400 with another computer system 1400. For example, the communication link 1415 may be a LAN, in which case the communication interface 1414 may be a LAN card, or the communication link 1415 may be a PSTN, in which case the communication interface 1414 may be an integrated services digital network (ISDN) card or a modem, or the communication link 1415 may be the Internet, in which case the communication interface 1414 may be a cable, wireless or analog modem.

A computer system 1400 may transmit and receive messages, data, and instructions, including program, i.e., application, code, through its respective communication link 1415 and communication interface 1414. Received program code may be executed by the respective processor(s) 1407 as it is received, and/or stored in the storage device 1410, or other associated non-volatile media, for later execution.

In an embodiment, the computer system 1400 operates in conjunction with a data storage system 1431, e.g., a data storage system 1431 that contains a database 1432 that is readily accessible by the computer system 1400. The computer system 1400 communicates with the data storage system 1431 through a data interface 1433. A data interface 1433, which is coupled to the bus 1406, transmits and receives electrical, electromagnetic or optical signals, that include data streams representing various types of signal information, e.g., instructions, messages and data. In embodiments, the functions of the data interface 1433 may be performed by the communication interface 1414.

Computer system 1400 includes a bus 1406 or other communication mechanism for communicating instructions, messages and data, collectively, information, and one or more processors 1407 coupled with the bus 1406 for processing information. Computer system 1400 also includes a main memory 1408, such as a random access memory (RAM) or other dynamic storage device, coupled to the bus 1406 for storing dynamic data and instructions to be executed by the processor(s) 1407. The main memory 1408 also may be used for storing temporary data, i.e., variables, or other intermediate information during execution of instructions by the processor(s) 1407.

The computer system 1400 may further include a read only memory (ROM) 1409 or other static storage device coupled to the bus 1406 for storing static data and instructions for the processor(s) 1407. A storage device 1410, such as a magnetic disk or optical disk, may also be provided and coupled to the bus 1406 for storing data and instructions for the processor(s) 1407.

A computer system 1400 may be coupled via the bus 1406 to a display device 1411, such as, but not limited to, a cathode ray tube (CRT), for displaying information to a user. An input device 1412, e.g., alphanumeric and other keys, is coupled to the bus 1406 for communicating information and command selections to the processor(s) 1407.

According to one embodiment, an individual computer system 1400 performs specific operations by their respective processor(s) 1407 executing one or more sequences of one or more instructions contained in the main memory 1408. Such instructions may be read into the main memory 1408 from another computer-usable medium, such as the ROM 1409 or the storage device 1410. Execution of the sequences of instructions contained in the main memory 1408 causes the processor(s) 1407 to perform the processes described herein. In alternative embodiments, hard-wired circuitry may be used in place of or in combination with software instructions. Thus, embodiments are not limited to any specific combination of hardware circuitry and/or software.

The term "computer-usable medium," as used herein, refers to any medium that provides information or is usable by the processor(s) 1407. Such a medium may take many forms, including, but not limited to, non-volatile, volatile and transmission media. Non-volatile media, i.e., media that can retain information in the absence of power, includes the ROM 1409, CD ROM, magnetic tape, and magnetic discs. Volatile media, i.e., media that can not retain information in the absence of power, includes the main memory 1408. Transmission media includes coaxial cables, copper wire and fiber optics, including the wires that comprise the bus 1406.

In the foregoing specification, the embodiments have been described with reference to specific elements thereof. It will, however, be evident that various modifications and changes may be made thereto without departing from the broader spirit and scope. For example, the reader is to understand that the specific ordering and combination of process actions shown in the process flow diagrams described herein is merely illustrative, and the embodiments can be performed using different or additional process actions, or a different combination or ordering of process actions. The specification and drawings are, accordingly, to be regarded in an illustrative rather than restrictive sense.

We claim:

1. A computer implemented method of determining a useful skew for a circuit design, comprising:
    using a computer configured for:
        identifying a plurality of sequential cells in the circuit design;
        determining an input slack value at an input pin and an output slack value at an output pin of each of the plurality of sequential cells along a path in the circuit design, wherein the input slack value comprises a required time and an arrival time at the input pin of the each of the plurality of the sequential cells;
        identifying one or more modifiable sequential cells from the plurality of sequential cells in the circuit design;
        discarding one or more of the plurality of sequential cells based at least in part on whether a clock tree is already built;
        determining a target slack value for each of at least some of the one or more modifiable sequential cells, wherein the target slack value comprises a statistical measure of the input slack value and the output slack value for the each of the at least some of the one or more modifiable sequential cells;
        comparing the target slack value with one or more previously determined target slack values to determine a minimum target slack value; and
        determining an amount of delay for the each of the at least some of the one or more modifiable sequential cells based at least in part on the minimum target slack value, in which
            the action of determining the amount of delay is characterized by being capable of being performed regardless of whether or not a clock tree for the circuit design has been built.

2. The method of claim 1, wherein the action of determining the target slack value and the action of comparing the target slack value with previously determined target slack values occur substantially simultaneously.

3. The computer implemented method of claim 1, wherein the action of identifying one or more modifiable sequential cells comprises identifying one or more delay-able sequential cells, each of the one or more delay-able cells comprising a cell which has an arrival time that can be delayed without worsening a slack on a path comprising the each of the one or more delay-able cells.

4. The method of claim 3, wherein the delay-able cell has a slack on a pin D that is a negative value and a slack on a pin Q that is greater than the slack on the D pin.

5. The computer implemented method of claim 1, wherein the action of identifying one or more modifiable sequential cells comprises identifying one or more advance-able cells, each of the one or more advance-able cells comprising a cell which has an arrival time that can be advanced without worsening a slack on a path comprising the each of the one or more advance-able cells.

6. The method of claim 5, wherein the advance-able cell has a slack on a pin Q that is a negative value and a slack on a pin D that is greater than the slack on the Q pin.

7. The method of claim 1, wherein discarding one or more cells comprises discarding each cell having a slack value on a D pin of the cell that is greater than zero or greater than or equal to a slack value on a Q pin of the cell.

8. The method of claim 7, wherein a clock tree exists for the circuit.

9. The method of claim 1, wherein discarding one or more cells comprises discarding each cell having a slack value on a Q pin of the cell that is greater than zero or greater than or equal to a slack value on a D pin of the cell.

10. The method of claim 9, wherein a clock tree has not been built.

11. The method of claim 10, wherein determining a delay for each cell comprises calculating the delay, where delay=minimum target slack−slack (D) on a C cell.

12. The method of claim 1, wherein determining the target slack for each cell comprises computing an average slack, where the average slack is $$\frac{(\text{slack}(D) + \text{slack}(Q))}{2}.$$

13. The method of claim 1 further comprising inserting a buffer into the circuit based on the determined delay.

14. The method of claim 13, in which the action of inserting a buffer into the circuit is performed while a clock tree of the circuit has been built.

15. The method of claim 1, further comprising adding a macro insertion delay to the circuit design based on the determined delay.

16. The method of claim 15, in which the action of adding a macro insertion delay to the circuit is performed while a clock tree of the circuit has not been built.

17. The method of claim 1, wherein the method is repeated until no more modifiable sequential cells can be identified.

18. The method of claim 1, wherein the modifiable cells are on a critical path.

19. The method of claim 1, wherein the method is performed without identifying talking flip-flops.

20. The method of claim 1, in which the computing a slack value for each sequential cell is performed on an input pin or an output pin of the each sequential cell.

21. The method of claim 1 further comprises inserting an inverter chain while a clock tree has been built.

22. The method of claim 1 further comprises asserting a delay on a cell clock pin while a clock tree has not been built.

23. The computer implemented method of claim 1, further comprising:
   repeating the action of determining the target slack value and the action of comparing the target slack value until all target slack values for each of the one or more modifiable sequential cells have been compared.

24. A system of determining a useful skew for a circuit design, comprising:
   a computer configured for performing:
      identifying a plurality of sequential cells in the circuit design;
      determining a slack value at an input pin and an output slack value at an output pin of each of the plurality of sequential cell in the circuit design, wherein the input slack value comprises a required time and an arrival time at the input pin of the each of the plurality of the sequential cells;
      identifying one or more modifiable sequential cells from the plurality of sequential cells in the circuit design;
      discarding one or more of the plurality of sequential cells based at least in part on whether a clock tree is already built;
      determining a target slack value for each of at least some of the one or more modifiable sequential cells, wherein the target slack value comprises a statistical measure of the input slack value and the output slack value for the each of the at least some of the one or more modifiable sequential cells;
      comparing the target slack value with one or more previously determined target slack values to determine a minimum target slack value; and
      determining an amount of delay for the each of the at least some of the one or more modifiable sequential cells based at least in part on the minimum target slack value, in which
      the action of determining the amount of delay is characterized by being capable of being performed regardless of whether or not a clock tree for the circuit design has been built.

25. The system of claim 24, wherein the computer configured for determining the target slack value and comparing operate substantially simultaneously.

26. The system of claim 24, wherein the computer configured for performing identifying the one or more modifiable sequential cells is further configured for performing identifying one or more delay-able sequential cells, each of the one or more delay-able cells comprising a cell which has an arrival time that can be delayed without worsening a slack value on a path comprising the each of the one or more delay-able cells.

27. The system of claim 26, wherein the delay-able cell has a slack on a pin D that is a negative value and a slack on a pin Q that is greater than the slack on the D pin.

28. The system of claim 24, wherein the computer configured for performing identifying the one or more modifiable sequential cells is further configured for performing identifying one or more advance-able cells, each of the one or more advance-able cells comprising a cell which ahs an arrival time that can be advanced without worsening a slack on a path comprising the each of the one or more advance-able cells.

29. The system of claim 28, wherein the advance-able cell has a slack on a pin Q that is a negative value and a slack on a pin D that is greater than the slack on the Q pin.

30. The system of claim 24, wherein the computer configured for discarding the one or more cells is further configured for discarding each cell having a slack value on a D pin of the cell that is greater than zero or greater than or equal to a slack value on a Q pin of the cell.

31. The system of claim 30, wherein a clock tree exists for the circuit.

32. The system of claim 24, wherein the computer configured for performing the act of discarding the one or more cells is further configured for discarding each cell having a slack value on a Q pin of the cell that is greater than zero or greater than or equal to a slack value on a D pin of the cell.

33. The system of claim 32, wherein a clock tree has not been built.

34. The system of claim 24, wherein the computer configured for performing the act of determining the target slack for each cell is further configured for performing computing an average slack, where the average slack is $$\frac{(\text{slack}(D) + \text{slack}(Q))}{2}.$$

35. The system of claim 34, wherein the computer configured for performing the act of determining an amount of delay is further configured for calculating the amount of delay, where the amount of delay=minimum target slack−slack (D) on a cell.

36. The system of claim 24, the computer is further configured for performing inserting a buffer into the circuit based on the amount of delay.

37. The system of claim 24, the computer is further configured for performing adding a macro insertion delay to the circuit design based on the amount of delay.

38. The system of claim 24, wherein the modifiable cells are on a critical path.

39. A computer program product comprising a computer readable medium having executable code to execute a method for determining a useful skew for a circuit design, the method comprising:

using a computer configured for:

identifying a plurality of sequential cells in the circuit design;

determining an input slack value at an input pin and an output slack value at an output pin of each of the plurality of sequential cells along a path in the circuit design, wherein the input slack value comprises a required time and an arrival time at the input pin of the each of the plurality of the sequential cells;

identifying one or more modifiable sequential cells from the plurality of sequential cells in the circuit design;

discarding one or more of the plurality of sequential cells based at least in part on whether a clock tree is already built;

determining a target slack value for each of at least some of the one or more modifiable sequential cells, wherein the target slack value comprises a statistical measure of the input slack value and the output slack value for the each of the at least some of the one or more modifiable sequential cells;

comparing the target slack value with one or more previously determined target slack values to determine a minimum target slack value; and determining an amount of delay for the each of the at least some of the one or more modifiable sequential cells based at least in part on the minimum target slack value, in which the action of determining the amount of delay is characterized by being capable of being performed regardless of whether or not a clock tree for the circuit design has been built.

40. The computer program product of claim 39, in which the action of identifying modifiable sequential cells of the method comprises identifying delay-able sequential cells, delay-able cells comprising cells that have an arrival time that can be delayed without worsening the slack value.

41. The computer program product of claim 39, in which the action of identifying modifiable sequential cells of the method comprises identifying advance-able cells, advance-able cells comprising cells that have an arrival time that can be advanced without worsening the slack value.

\* \* \* \* \*